(12) United States Patent
Hamamura et al.

(10) Patent No.: US 10,884,077 B2
(45) Date of Patent: Jan. 5, 2021

(54) INDUCTANCE ELEMENT FOR MAGNETIC SENSOR AND CURRENT SENSOR INCLUDING THE SAME

(71) Applicant: TDK Corporation, Tokyo (JP)

(72) Inventors: Takahiro Hamamura, Tokyo (JP); Takashi Osada, Tokyo (JP); Masafumi Kami, Tokyo (JP); Adrian Lo, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/725,568

(22) Filed: Oct. 5, 2017

(65) Prior Publication Data

US 2018/0106874 A1  Apr. 19, 2018

(51) Int. Cl.
| | |
|---|---|
| *H01F 17/04* | (2006.01) |
| *G01R 33/06* | (2006.01) |
| *G01R 15/18* | (2006.01) |
| *G01R 33/04* | (2006.01) |
| *H01F 27/28* | (2006.01) |

(52) U.S. Cl.
CPC ......... *G01R 33/063* (2013.01); *G01R 15/183* (2013.01); *G01R 15/186* (2013.01); *G01R 33/04* (2013.01); *H01F 27/28* (2013.01)

(58) Field of Classification Search
CPC ........ H01F 3/08; H01F 3/10; H01F 2003/106; H01F 27/28; H01F 27/255; H01F 27/29; H01F 27/292; H01F 17/045; H01F 2017/0093; G01R 33/063; G01R 33/04; H01R 15/186; H01R 15/183

USPC .................................. 336/83, 212, 192, 233
See application file for complete search history.

(56) References Cited

U.S. PATENT DOCUMENTS

| | | | | |
|---|---|---|---|---|
| 4,309,655 A | * | 1/1982 | Lienhard | G01R 19/20 324/117 R |
| 6,242,996 B1 | * | 6/2001 | Sato | H01F 17/045 336/174 |
| 6,373,366 B1 | * | 4/2002 | Sato | H01F 17/045 336/192 |
| 7,633,366 B2 | * | 12/2009 | Hirai | H01F 17/045 336/83 |
| 10,256,031 B2 | * | 4/2019 | Baker | H01F 27/2823 |
| 2007/0063804 A1 | * | 3/2007 | Watanabe | H01F 3/10 336/83 |

(Continued)

FOREIGN PATENT DOCUMENTS

| | | |
|---|---|---|
| JP | 2011-112634 A | 6/2011 |
| WO | 2009093178 A1 | 7/2009 |

*Primary Examiner* — Mang Tin Bik Lian
(74) *Attorney, Agent, or Firm* — Young Law Firm, P.C.

(57) ABSTRACT

Disclosed herein is an inductance element for a magnetic sensor. The inductance element includes a first core comprising a first soft magnetic material and having first and second connecting surfaces, a second core comprising a second soft magnetic material different from the first soft magnetic material and having third and fourth connecting surfaces facing the first and second connecting surfaces, respectively, and a coil wound around the first core between the first and second connecting surfaces, wherein the first core is larger in magnetic field strength at which magnetic saturation occurs than the second core, and wherein the second core is higher in permeability than the first core and has at least partially a meander shape.

17 Claims, 14 Drawing Sheets

(56) References Cited

U.S. PATENT DOCUMENTS

2011/0121935 A1 5/2011 Chu et al.
2012/0133469 A1* 5/2012 Tomonari .................. H01F 3/14
336/192

* cited by examiner

INDUCTANCE ELEMENT FOR MAGNETIC SENSOR AND CURRENT SENSOR INCLUDING THE SAME

BACKGROUND OF THE INVENTION

Field of the Invention

The present invention relates to an inductance element for using a magnetic sensor and a current sensor including the magnetic sensor, and more particularly relates to an inductance element for using a fluxgate magnetic sensor and a current sensor including the fluxgate magnetic sensor.

Description of Related Art

A fluxgate magnetic sensor is known as a magnetic sensor that detects an external magnetic field. International Publication WO2009/093178 and Japanese Patent Application Laid-open No. 2011-112634 describe examples of the fluxgate magnetic sensor.

The fluxgate magnetic sensor described in International Publication WO2009/093178 has a configuration in which a coil is wound around a fluxgate core made of an amorphous magnetic metal or the like, and can detect a magnetic field occurring according to a current flowing through a bus bar. However, the fluxgate magnetic sensor described in International Publication WO2009/093178 has an open magnetic circuit structure and thus the number of windings of the coil needs to be increased to obtain a sufficient inductance, which is not suitable for downsizing.

Japanese Patent Application Laid-open No. 2011-112634 discloses a fluxgate magnetic sensor having a closed magnetic circuit structure. The fluxgate magnetic sensor described in Japanese Patent Application Laid-open No. 2011-112634 has a low resistance portion made of permalloy and a high resistance portion made of ferrite, which are joined together in a ring shape to provide the closed magnetic circuit structure. In Japanese Patent Application Laid-open No. 2011-112634, the fluxgate magnetic sensor is formed by winding a coil around the low resistance portion made of permalloy.

However, because the coil is wound around the low resistance portion made of permalloy in the fluxgate magnetic sensor described in Japanese Patent Application Laid-open No. 2011-112634, there is a problem that the measurement range of the magnetic sensor is restricted by the saturation flux density of the lower resistance portion and the measurement range is narrow.

Further, in the flux-gate magnetic sensor described in Japanese Patent Application Laid-open No. 2011-112634, both the low resistance part formed of permalloy and the high resistance part formed of ferrite have a linear shape, so that a change in the length of a magnetic path involves the necessity of changing the size of the magnetic sensor itself for adjustment of characteristics, making design complicated.

SUMMARY

It is therefore an object of the present invention to provide an inductance element for a flux-gate type magnetic sensor having a closed magnetic path structure and a wide measurement range and facilitating adjustment of characteristics at the time of designing, and a current sensor having the same.

An inductance element for a magnetic sensor according to the present invention includes a first core comprising a first soft magnetic material and having first and second connecting surfaces; a second core comprising a second soft magnetic material different from the first soft magnetic material and having third and fourth connecting surfaces facing the first and second connecting surfaces, respectively; and a coil wound around the first core between the first and second connecting surfaces, wherein the first core is larger in magnetic field strength at which magnetic saturation occurs than the second core, and wherein the second core is higher in permeability than the first core and has at least partially a meander shape.

A current sensor according to the present invention includes a bus bar through which current to be measured flows, the inductance element for a magnetic sensor disposed near the bus bar, and a detection circuit that monitors voltage appearing at both ends of the coil.

According to the present invention, the first and second cores have a closed magnetic path structure, and the coil is wound around the first core larger in magnetic field strength at which magnetic saturation occurs than the second core, so that adequate magnetic characteristics can be maintained even in magnetic field where the second core is magnetically saturated. In addition, at least a part of the second core is formed into a meander shape, so that it is possible to arbitrarily change the magnetic path length without changing the entire size. As a result, there can be provided an inductance element for a magnetic sensor having high inductance and a wide measurement range and facilitating adjustment of characteristics at the time of designing, and a current sensor having the same.

In the present invention, the closed magnetic path part of the second core positioned between the third and fourth connecting surfaces may have a meander shape. With this configuration, it is possible to increase the magnetic path length of the closed magnetic path part without changing the entire size.

In the present invention, the second core may have a closed magnetic path part positioned between the third and fourth connecting surfaces and a protruding part positioned on the side opposite to the closed magnetic path part when viewed from the third or fourth connecting surface, and at least one of the closed magnetic path part and the protruding part may have a meander shape. When the protruding part is provided in the second core, detection sensitivity is enhanced, and change in inductance with respect to a change in magnetic field strength becomes more linear. When at least one of the closed magnetic path part and the protruding part is formed into a meander shape in such a structure, an increase in the entire size can be suppressed.

In the present invention, it is preferable that the first core is a drum-shaped core having a winding core part around which the coil is wound and first and second flange parts provided respectively on both sides of the winding core part in the axial direction, that the first flange part has a first terminal electrode connected with one end of the coil, that the second flange part has a second terminal electrode connected with the other end of the coil, that the surface of the first flange part parallel to the axial direction constitutes the first connecting surface, and that the surface of the second flange part parallel to the axial direction constitutes the second connecting surface. With this configuration, a drum-shaped core that is widely used in a surface-mount type coil component can be used, achieving cost reduction.

In the present invention, the second core may have a layered structure in the thickness direction. With this configuration, it is possible to widen a range where magnetic field can be measured with high sensitivity while suppressing an eddy current loss.

In the present invention, it is preferable that the first and second cores are positioned relative to each other without intervention of an adhesive. With this configuration, stress due to contraction of the adhesive is not applied to the second core, allowing achievement of designed magnetic characteristics.

In this case, a support member for positioning the second core relative to the first core may be provided, the support member may have an adhesive surface in which a concave part for housing the second core is formed, and the adhesive surface of the support member is adhered to the first and second connecting surfaces of the first core, whereby the second core may be positioned, sandwiched between the concave part of the support member and the first core.

In the present invention, it is preferable that the first soft magnetic material be ferrite and the second soft magnetic material be amorphous magnetic metal. With this configuration, there can be provided a low-cost and high-sensitivity inductance element for a magnetic sensor and a current sensor having the same.

As described above, according to the present invention, there can be provided an inductance element for a flux-gate type magnetic sensor having a closed magnetic path structure and having thus high inductance, having a wide measurement range, and facilitating adjustment of characteristics at the time of designing and a current sensor having the same.

BRIEF DESCRIPTION OF THE DRAWINGS

The above features and advantages of the present invention will be more apparent from the following description of certain preferred embodiments taken in conjunction with the accompanying drawings, in which:

FIG. 1A is a perspective view showing an external appearance, FIG. 1B is a side view cut along a plane A in FIG. 1A, and FIG. 1C is an exploded perspective view;

DETAILED DESCRIPTION OF THE EMBODIMENTS

Preferred embodiments of the present invention will be explained below in detail with reference to the accompanying drawings.

Figures 1A, 1B:
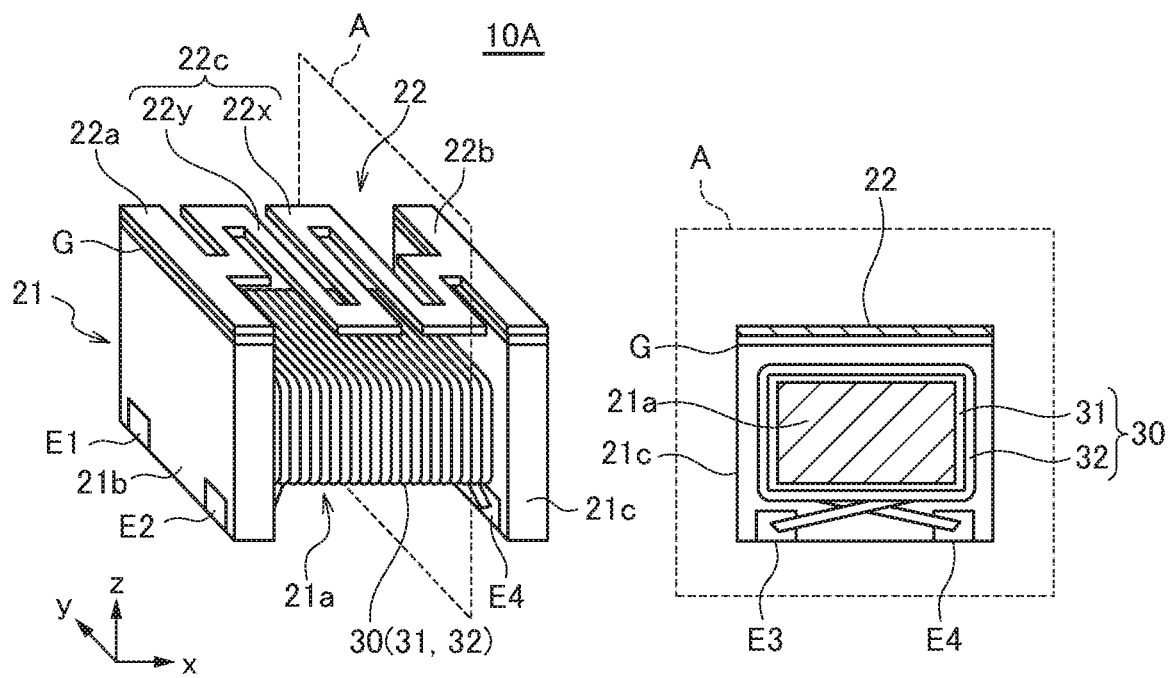
FIGS. 1A to 1C show a configuration of an inductance element 10A for using a magnetic sensor according to a first embodiment of the present invention, where
Figure 1C:
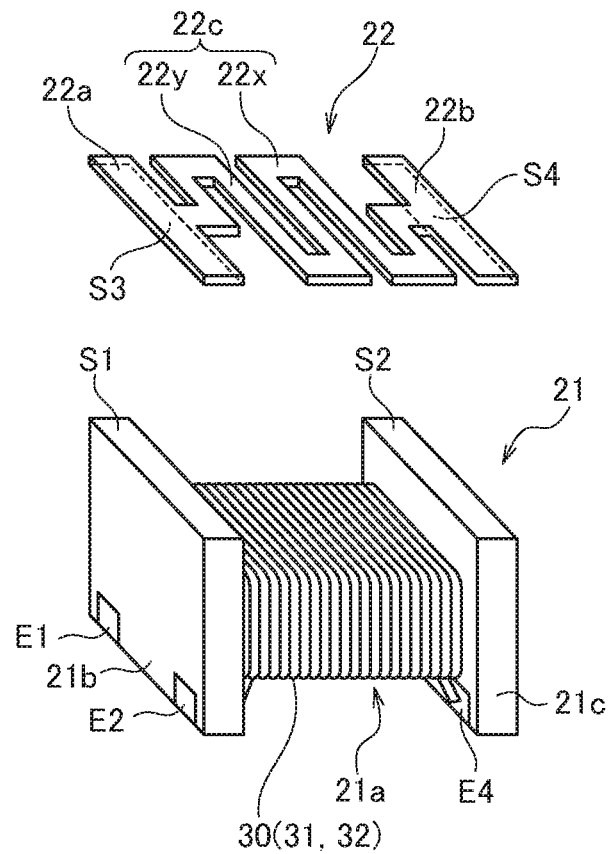

FIGS. 1A to 1C are views each illustrating the configuration of an inductance element 10A for a magnetic sensor according to the first embodiment of the present invention. FIG. 1A is a perspective view illustrating the outer appearance, FIG. 1B is a cross-sectional view taken along the plane A of FIG. 1A, and FIG. 1C is an exploded perspective view.

The inductance element 10A for a magnetic sensor according to the present embodiment is a surface-mount type inductance element for a flux-gate type magnetic sensor and has a drum-shaped first core 21, a plate-like second core 22 having a meander shape, and a coil 30 (31, 32) wound around the first core 21 as illustrated in FIGS. 1A to 1C.

The first core 21 is made of a soft magnetic material such as ferrite and has a winding core portion 21a around which the coil 30 is wound, and first and second flange portions 21b and 21c provided on both ends of the winding core portion 21a in the axial direction (x-direction), respectively. The flange portions 21b and 21c have a larger diameter, i.e., a larger size of y-direction and z-direction, than that of the winding core portion 21a viewed in the axial direction, which facilitates an operation of winding the coil 30 and prevents fall-off of the coil 30. One or more terminal electrodes are provided for each of the flange portions 21b and 21c, and one end and the other end of the coil 30 are connected to the corresponding terminal electrodes. In the example shown in FIGS. 1A to 1C, the coil 30 includes two coils 31 and 32 and one end of each of these coils 31 and 32 is connected to terminal electrodes E1 and E2 provided on the flange portion 21b, respectively, and the other ends thereof are connected to terminal electrodes E3 and E4 provided on the flange portion 21c, respectively.

Figure 2:
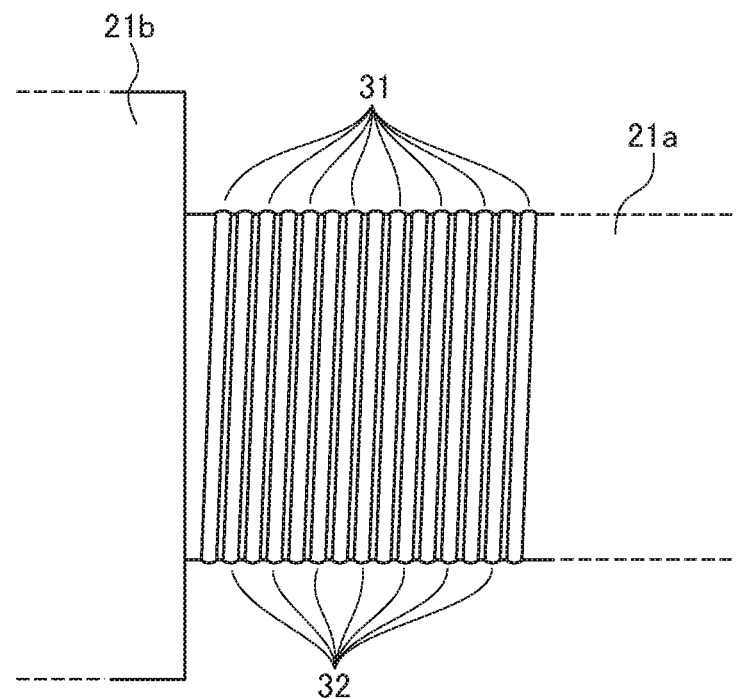
FIG. 2 shows an example that coils 31 and 32 are wound in bifilar.

When the coil 30 includes the two coils 31 and 32, the numbers of turns of these two coils 31 and 32 can be the same or different from each other. When the numbers of turns of the two coils 31 and 32 are the same, it is preferable to bifilar wind the coils 31 and 32 as shown in FIG. 2. This can strengthen magnetic coupling with the coils 31 and 32.

The flange parts 21b and 21c of the first core 21 have first and second connecting surfaces S1 and S2, respectively, that face the second core 22. The connecting surfaces S1 and S2 are defined as the xy plane parallel to the axial direction of the winding core part 21a and constitute a top surface positioned on the side opposite to a bottom surface on which the terminal electrodes E1 to E4 are formed. The terminal electrodes E1 to E4 are formed not only on the bottom surface but also on the yz plane perpendicular to the axial direction so that a solder fillet is formed during the surface mounting. The connecting surfaces S1 and S2 of the first core 21 may be subjected to mirror polishing treatment by diamond polishing or buffing. Applying the mirror polishing treatment to the connecting surfaces S1 and S2 can prevent a minute air layer from being generated when the connecting surfaces S1 and S2 are connected to connecting surfaces S3 and S4 (to be described later) of the second core 22, thereby enhancing adhesion between the connecting surfaces S1 and S2 and the connecting surfaces S3 and S4.

The second core 22 is made of a soft magnetic material such as amorphous magnetic metal and has a plate-like shape having the xy plane. As illustrated in FIGS. 1A to 1C, the second core 22 has a connecting part 22a constituting the connecting surface S3, a connecting part 22b constituting the connecting surface S4, and a closed magnetic path part 22c positioned between the connecting parts 22a and 22b. The connecting surfaces S3 and S4 face the connecting surfaces S1 and S2, respectively. In the present embodiment, the connecting surfaces S3 and S4 and the connecting surfaces S1 and S2 are fixed to each other through an adhesive layer G formed of a resin-based adhesive such as an epoxy-based adhesive. Thus, in the present embodiment, the adhesive layer G is interposed between the connecting surfaces S1 and S3, and the adhesive layer G is interposed between the connecting surfaces S2 and S4.

The closed magnetic path part 22c has a meander shape. Specifically, the closed magnetic path part 22c has a configuration in which a first part 22x extending in the x-direction and a second part 22y extending in the y-direction are alternately arranged. In the example illustrated in FIGS. 1A to 1C, six first parts 22x and five second parts 22y are provided, but not limited thereto. With this configuration, the length of the magnetic path along the closed magnetic path part 22c is longer than the linear distance between the connecting surfaces S3 and S4, so that it is possible to adjust the magnetic path length of the second core 22 without changing the size of the first core 21 in the x-direction.

Figure 3:
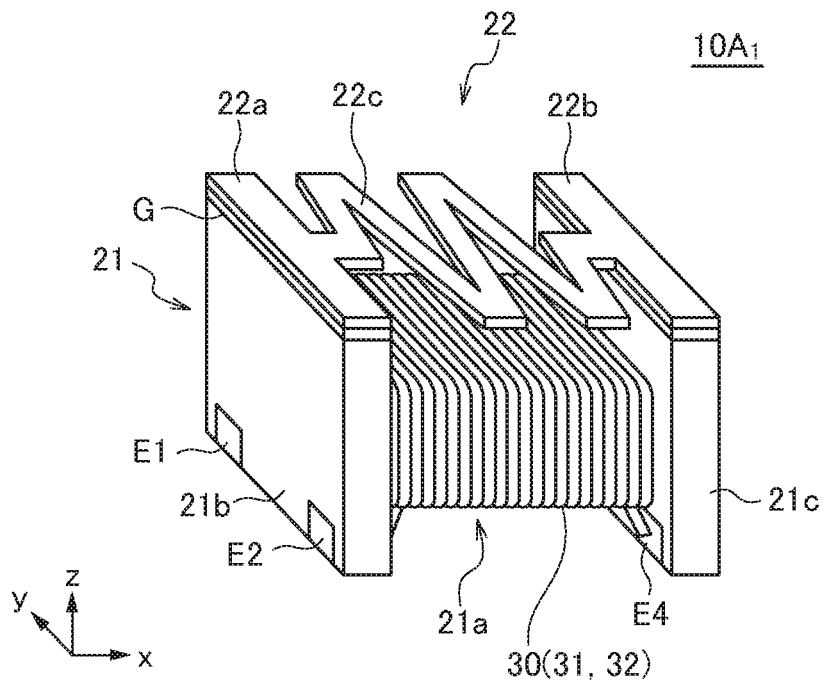
FIG. 3 is a perspective view showing a first modification of the inductance element 10A for using a magnetic sensor.
Figure 4:
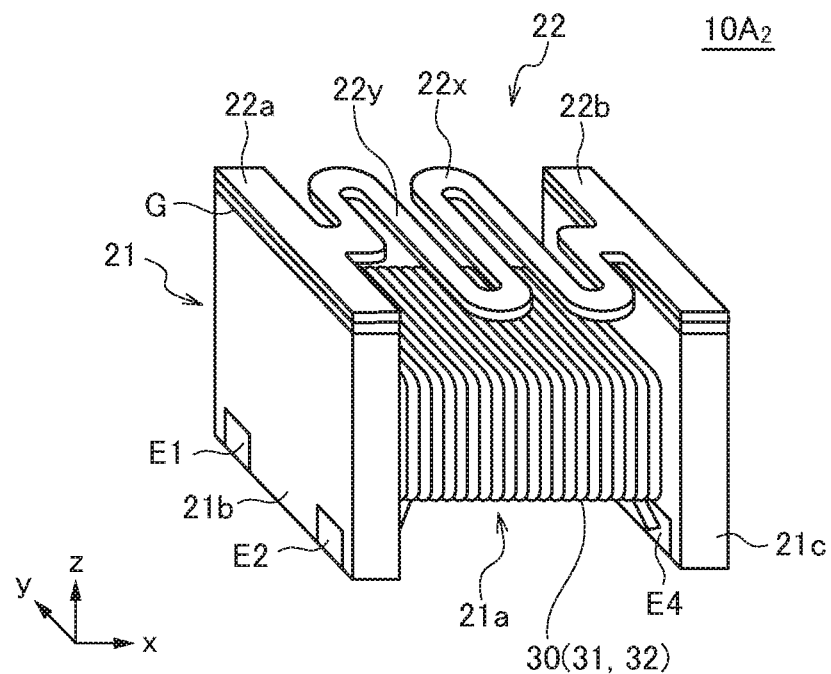
FIG. 4 is a perspective view showing a second modification of the inductance element 10A for using a magnetic sensor.
Figure 5:
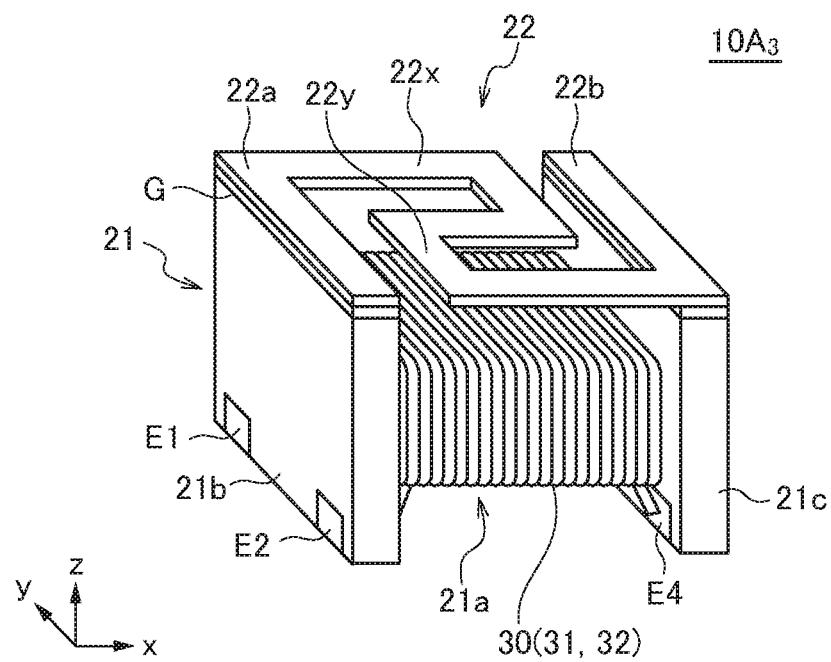
FIG. 5 is a perspective view showing a third modification of the inductance element 10A for using a magnetic sensor.

The meander shape in the present invention is not limited to the shape of the closed magnetic path part 22c illustrated in FIGS. 1A to 1C, but may be any shape as long as magnetic flux meanders. Thus, the closed magnetic path part 22c may have a shape obliquely extending like an inductance element $10A_1$ for a magnetic sensor illustrated in FIG. 3, may have a shape in which a connecting part between the first part 22x and the second part 22y are curved like an inductance element $10A_2$ for a magnetic sensor illustrated in FIG. 4, or may have a shape in which the first part 22x is folded back in the opposite direction like an inductance element $10A_3$ for a magnetic sensor illustrated in FIG. 5.

With this configuration, the first core 21 and the second core 22 constitute a closed magnetic circuit and the coil 30 is wound around the first core 21. The coil 30 is not wound around the second core 22. Because the first core 21 and the second core 22 constitute the closed magnetic circuit in this way, a higher inductance can be achieved with a smaller number of windings relative to an open magnetic circuit structure as described in International Publication WO2009/093178. Conversely, a smaller number of turns suffices to achieve the same inductance in a closed magnetic circuit structure.

The first core 21 reaches magnetic saturation at a higher magnetic field intensity than that of the second core 22 and is made of a soft magnetic material having a lower magnetic permeability than that of the second core 22. That is, a magnetic material that can apply a larger magnetic field until the saturation flux density is achieved than that of the second core 22 is selected. Although not particularly limited, the soft magnetic material that forms the first core 21 can be Mn—Zn ferrite, Ni—Zn ferrite, sendust, permalloy, or the like and it is particularly preferable to use Ni—Zn ferrite. Because having a high insulating resistance, Ni—Zn ferrite is not electrically short-circuited even when the coil 30 is directly wound therearound. Meanwhile, in a case where Mn—Zn ferrite or the like having a low insulating resistance is used, short-circuiting may occur when the film of the coil 30 peels off for some reason and therefore it is preferable to perform processing for increasing the insulating property, such as parylene coating, to the surface of the first core 21.

The second core 22 reaches magnetic saturation at a lower magnetic field intensity than that of the first core 21 and is made of a soft magnetic material having a higher magnetic permeability than that of the first core 21. Although not particularly limited, a Fe/Co amorphous magnetic metal is preferably used as the material of the second core 22. In a case where a Fe/Co amorphous magnetic metal is used, the Fe/Co amorphous magnetic metal is preferably formed by a roll-to-roll method into a thin plane having a thickness equal to or smaller than 50 μm. When the roll-to-roll method is used, a heated raw material of an amorphous magnetic plate is cooled rapidly through contact with a roll having a large heat capacity. At that time, a surface being in contact with the roll and a surface not being in contact with the roll are different in temperature histories and thus have a difference in compositions. Accordingly, one of the surfaces becomes a high gloss surface and the other surface becomes a low gloss surface. In the first embodiment, it is preferable to place the second core 22 in such a manner that the low gloss surface faces the first core 21. This placement provides satisfactory magnetic coupling between the first core 21 and the second core 22 and can suppress a reduction in the inductance.

Because the Fe/Co amorphous magnetic metal is relatively fragile, it is difficult to wind the coil 30 around the Fe/Co amorphous magnetic metal. However, in the first embodiment, the coil 30 is wound around the first core 21 having a relatively high mechanical strength and the coil 30 is not wound around the second core 22. Therefore, the thickness of the Fe/Co amorphous magnetic metal can be reduced, for example, to be equal to or smaller than 50 μm.

Figure 6:
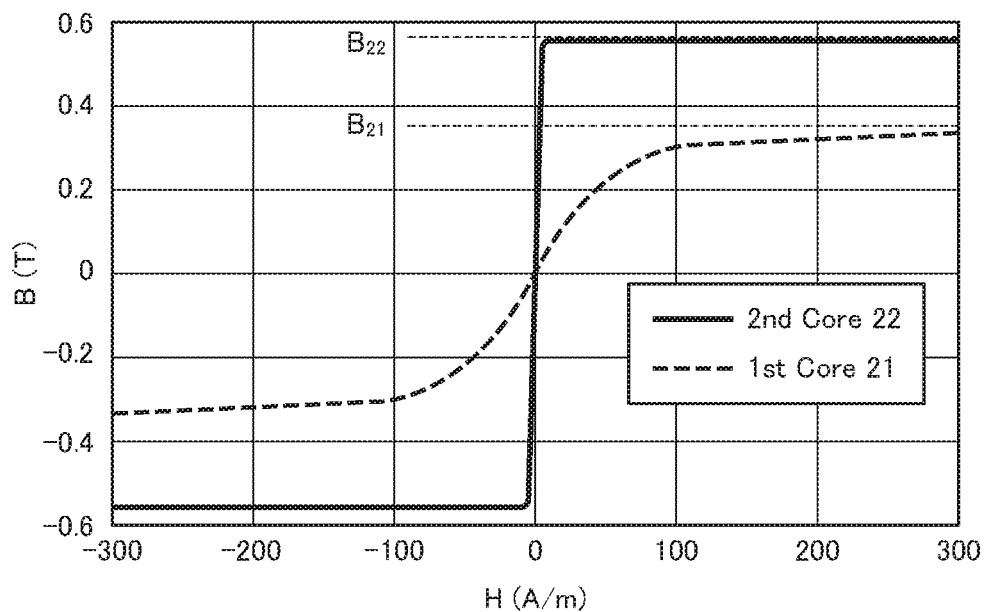
FIG. 6 is a graph showing magnetic characteristics of a first core 21 and a second core 22.

FIG. 6 is a graph showing magnetic characteristics of the first core 21 and the second core 22.

As shown in FIG. 6 in which the horizontal axis represents the magnetic field intensity H (A/m) and the vertical axis represents the flux density B (T), a relation between a saturation flux density $B_{21}$ of the first core 21 and a saturation flux density $B_{22}$ of the second core 22 in a case of assuming only ideal magnetization without considering hysteresis characteristics is:

$B_{21} < B_{22}$.

On the other hand, a magnetic field intensity at which the saturation flux density is achieved is sufficiently larger in the first core 21 than in the second core 22. Accordingly, the magnetic flux density of a closed magnetic circuit constituted by the first core 21 and the second core 22 steeply changes at a magnetic field intensity at which the second core 22 is not magnetically saturated and gradually changes at a magnetic field intensity at which the second core 22 is magnetically saturated.

One of major characteristics of the inductance element 10A for a magnetic sensor according to the first embodiment is that the coil 30 is wound only around the first core 21. If the coil 30 is wound around the second core 22, the measurement range of the magnetic sensor is restricted by magnetic saturation of the second core 22 and a measurable magnetic field intensity range is narrowed. This problem occurs in the magnetic sensor described in Japanese Patent Application Laid-open No. 2011-112634. In contrast thereto, because the coil 30 is wound around the first core 21 reaching the magnetic saturation at a high magnetic field intensity in the inductance element 10A for a magnetic sensor according to the first embodiment, highly-sensitive detection can be performed by the second core 22 in a weak magnetic field in which the second core 22 is not completely saturated. Furthermore, even in an intense magnetic field in which the second core 22 is completely saturated, detection can be performed using the magnetic characteristics of the first core 21 unless the first core 21 is completely saturated.

The amount of magnetic saturation can be adjusted by a gap between the first core 21 and the second core 22. The size of the gap can be controlled by the thickness of the adhesion layer G. To form a gap having a desired size, it suffices to fix a positional relation between the first core 21 and the second core 22 during a process of solidifying a liquid of a resin adhesive being a source of the adhesion layer G.

Figure 7:
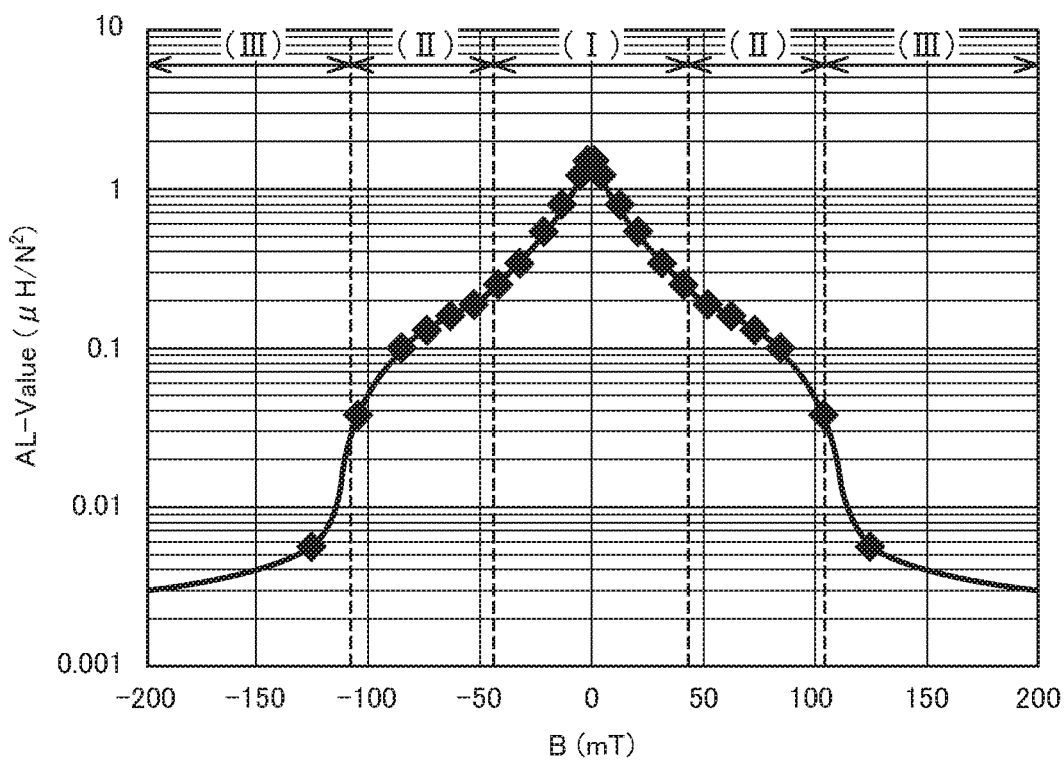
FIG. 7 is a graph showing magnetic characteristics of the inductance element 10A for using a magnetic sensor.

FIG. 7 is a graph showing magnetic characteristics of the inductance element 10A for using a magnetic sensor.

As shown in FIG. 7 in which the horizontal axis represents the magnetic flux density B (mT) and the vertical axis represents the inductance (AL-Value) per turn of the coil 30, three regions according to the magnetic flux density can be defined. A first region (I) is a region in which the inductance changes steeply and corresponds to a range in which the second core 22 is not magnetically saturated. A second region (II) is a region in which the inductance changes gradually and corresponds to a range in which the second core 22 is magnetically saturated and the first core 21 is not magnetically saturated. A third region (III) is a region in which the inductance changes little and corresponds to a range in which the first core 21 is magnetically saturated. The magnetic sensor functions in the first region (I) and the second region (II). Out of these regions, measurement with a higher sensitivity can be performed in the first region (I).

While the first region (I) is a region in which neither the first core 21 nor the second core 22 is magnetically saturated, the magnetic characteristics of the second core 22 appear more remarkably than those of the first core 21 because the magnetic permeability (=dB/dH) of the second core 22 made of an amorphous magnetic metal or the like is considerably higher than that of the first core 21 made of ferrite or the like in the first region (I). According to definition of the inductance, the inductance is proportional to the magnetic permeability and thus also becomes high under a condition in which the magnetic permeability is high. As described above, the second core 22 made of an amorphous magnetic metal or the like has a high magnetic permeability and is easily magnetically saturated. Therefore, a magnetic field (magnetic flux density) can be detected with quite a high sensitivity in the first region (I). However, because the amorphous magnetic metal is easily magnetically saturated, the magnetic permeability rapidly lowers and changes thereof become small.

The second region (II) is a region in which the magnetic permeability of the second core 22 made of an amorphous magnetic metal or the like is sufficiently low while the magnetic permeability of the first core 21 made of ferrite or the like is kept. The magnetic characteristics of the first core 21 are dominant in this region. While being lower in the magnetic permeability in a weak magnetic field region than that of the amorphous magnetic metal, ferrite has a wider magnetic field range in which the magnetic permeability can be kept as a trade-off. Therefore, the magnetic field (magnetic flux density) can be detected in the second region (II) by the magnetic characteristics of ferrite.

As explained above, in the inductance element 10A for a magnetic sensor according to the first embodiment, the first core 21 made of ferrite or the like and the second core 22 made of a Fe/Co amorphous magnetic metal or the like are connected in the shape of a ring to form a closed magnetic circuit and the coil 30 is wound around the first core 21 that is not easily magnetically saturated. Accordingly, detection with quite a high sensitivity can be performed using the magnetic characteristics of the second core 22 in a low magnetic flux density region, and changes in the inductance (AL-Value) can be maintained using the magnetic characteristics of the first core 21 also in a middle magnetic flux density region.

Furthermore, because using a drum core made of ferrite or the like as the first core 21, the inductance element 10A for a magnetic sensor according to the first embodiment can be manufactured at a low cost by diversion of a surface-mounting coil component. For example, a common mode filter, a pulse transformer, a transponder coil, or a normal mode (differential mode) coil can be diverted. In any case, it suffices to bond the second core 22 made of an amorphous magnetic metal or the like, instead of bonding a plate-like core made of ferrite or the like, to a drum core after winding the coil 30 around a winding core portion of the drum core. This enables a manufacturing line of other coil components to be used substantially as it is.

Further, in the inductance element 10A for a magnetic sensor according to the present embodiment, the closed magnetic path part 22c of the second core 22 has a meander shape, so that it is possible to adjust the magnetic path length of the second core 22 without changing the size of the first core 21 in the x-direction, thereby facilitating adjustment of characteristics at the time of designing.

Figure 8:
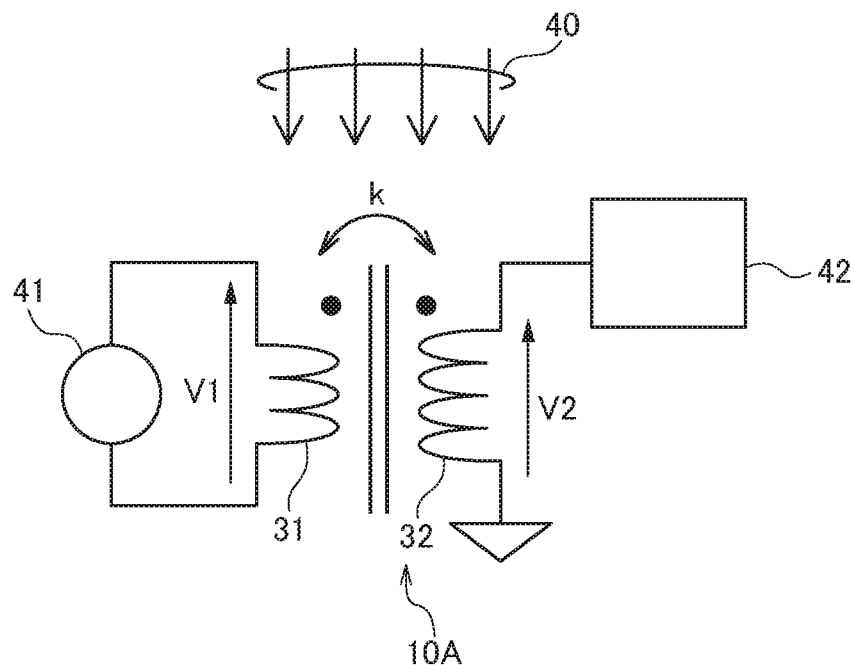
FIG. 8 is an equivalent circuit diagram showing a use example of the inductance element 10A for using a magnetic sensor.

FIG. 8 is an equivalent circuit diagram showing a use example of the inductance element 10A for a magnetic sensor according to the present embodiment.

In the example shown in FIG. 8, the two coils 31 and 32 are wound in the inductance element 10A for a magnetic sensor, one of which is used as an exciting coil 31 and the other of which is used as a detecting coil 32. An inductance component of the exciting coil 31 and an inductance component of the detecting coil 32 are magnetically coupled with a predetermined magnetic coupling coefficient k. To be exact, there are resistance components of the coils 31 and 32 and the cores 21 and 22, such as copper loss and iron loss (hysteresis loss, eddy-current loss, and residual loss), and capacitance components such as parasitic capacitance. However, to simplify explanations, these components are not illustrated in the equivalent circuit shown in FIG. 8.

A signal generation circuit 41 is connected to the exciting coil 31. The signal generation circuit 41 is a circuit capable of generating an input voltage V1 with a rectangular wave, a sine wave, or a triangular wave. One end of the detecting coil 32 is grounded and the other end thereof is connected to a detection circuit 42. Therefore, a detection voltage V2 applied to the both ends of the detecting coil 32 is input to the detection circuit 42.

While a ratio of the number of windings between the exciting coil 31 and the detecting coil 32 is not particularly limited, a case in which the number of turns in the detecting coil 32 is larger than that of the exciting coil 31 is assumed in the example shown in FIG. 8. The exciting coil 31 and the detecting coil 32 are magnetically coupled to each other with the predetermined magnetic coupling coefficient k. As the magnetic coupling coefficient k is larger, an electrical signal input to the exciting coil 31 propagates to the detecting coil 32 with less attenuated.

When an external magnetic field 40 is applied, the inductance of the exciting coil 31 and the inductance of the detecting coil 32 lower according to the characteristics shown in FIG. 7. As a result, a voltage waveform output to the detecting coil 32 changes according to the intensity of the external magnetic field 40.

Figure 9:
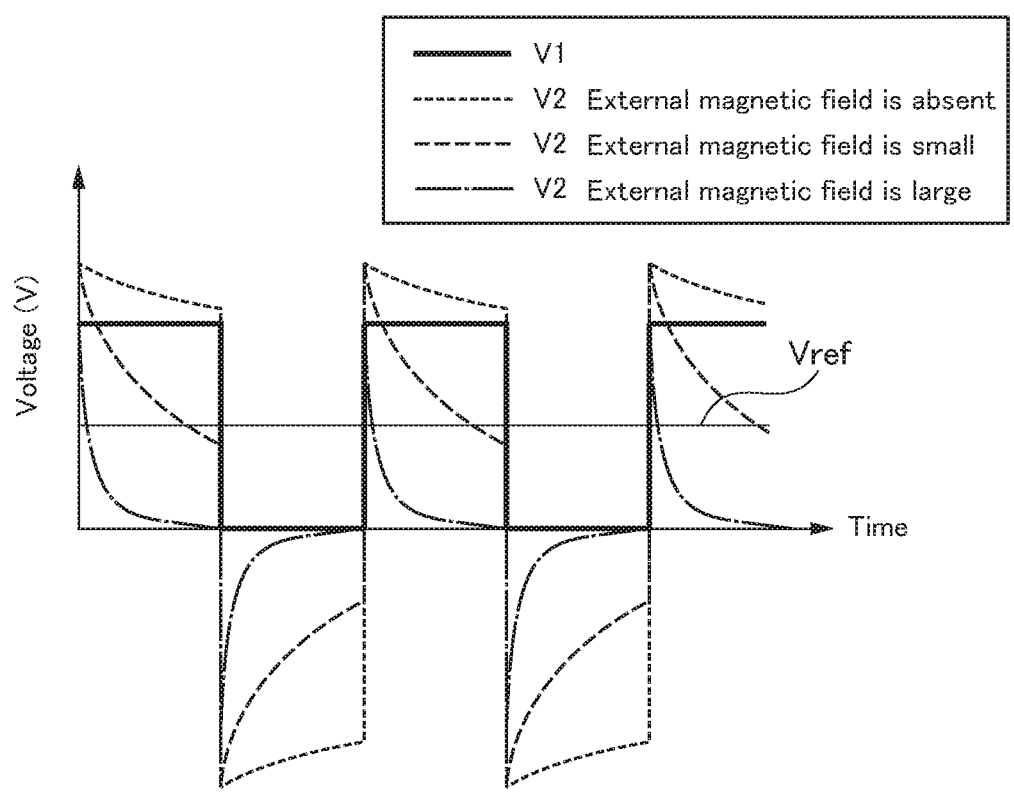
FIG. 9 is a waveform chart showing a relation between an external magnetic field 40 and a detection voltage V2 appearing on a detecting coil 32.

FIG. 9 is a waveform chart illustrating the relationship between the external magnetic field 40 and a detection voltage V2 that appears in the detection coil 32.

In the example of FIG. 9, the input voltage V1 of a rectangular wave is generated from the signal generation circuit 41 and applied to the excitation coil 31.

In the absence of the external magnetic field 40, the detection voltage V2 that appears in the detection coil 32 is output as a rectangular waveform in which the level of the flat portion is slightly decreased over time as denoted by the dotted line of FIG. 9. When there is no tendency of magnetic saturation, the decrease itself does not occur; however, the inductance element 10A for a magnetic sensor tends to undergo magnetic saturation by the current from the signal generation circuit 41, and this causes the decrease.

When the external magnetic field 40 is small, saturation of the inductance element for a magnetic sensor 10A is accelerated by the external magnetic field 40, so that the inductance value is reduced as compared to a case where the external magnetic field 40 is absent, with the result that the waveform denoted by the dashed line of FIG. 9 is exhibited.

When the external magnetic field 40 is large, the inductance element 10A for a magnetic sensor is saturated more strongly by the external magnetic field 40 and the current from the signal generation circuit 41. Thus, as denoted by the dashed dotted line, a waveform falls abruptly immediately before the rise.

In this way, the waveform of the detection voltage V2 appearing on the detecting coil 32 changes according to the intensity of the external magnetic field 40. These changes are detected by the detection circuit 42 and the level of the external magnetic field 40 can be measured by analyzing the waveform of the detection voltage V2.

A comparator can be used as the detection circuit 42. A comparator is a circuit or an element that determines whether an input voltage is larger than a reference voltage Vref. When a comparator compares the detection voltage V2 with the reference voltage Vref, a period in which the detection voltage V2 exceeds the reference voltage Vref and a period in which the detection voltage V2 does not exceed the reference voltage Vref appear alternately in a half cycle in the case where these is no external magnetic field 40. Therefore, the duty of a signal output from the comparator is about 50%.

On the other hand, in the case where the external magnetic field 40 is weak, the period in which the detection voltage V2 exceeds the reference voltage Vref becomes shorter and correspondingly the period in which the detection voltage V2 does not exceed the reference voltage Vref becomes longer. In this case, the duty of the signal output from the comparator becomes lower than 50%.

In the case where the external magnetic field 40 is intense, the period in which the detection voltage V2 exceeds the reference voltage Vref becomes much shorter and correspondingly the period in which the detection voltage V2 does not exceed the reference voltage Vref becomes much longer. In this case, the duty of the signal output from the comparator becomes much lower than 50%.

As described above, as the external magnetic field 40 is more intense, the period in which the detection voltage V2 exceeds the reference voltage Vref becomes shorter and the duty of the signal output from the comparator correspondingly becomes lower. Therefore, when the duty of the signal output from the comparator is analyzed, the level of the external magnetic field 40 can be estimated.

Figure 10:
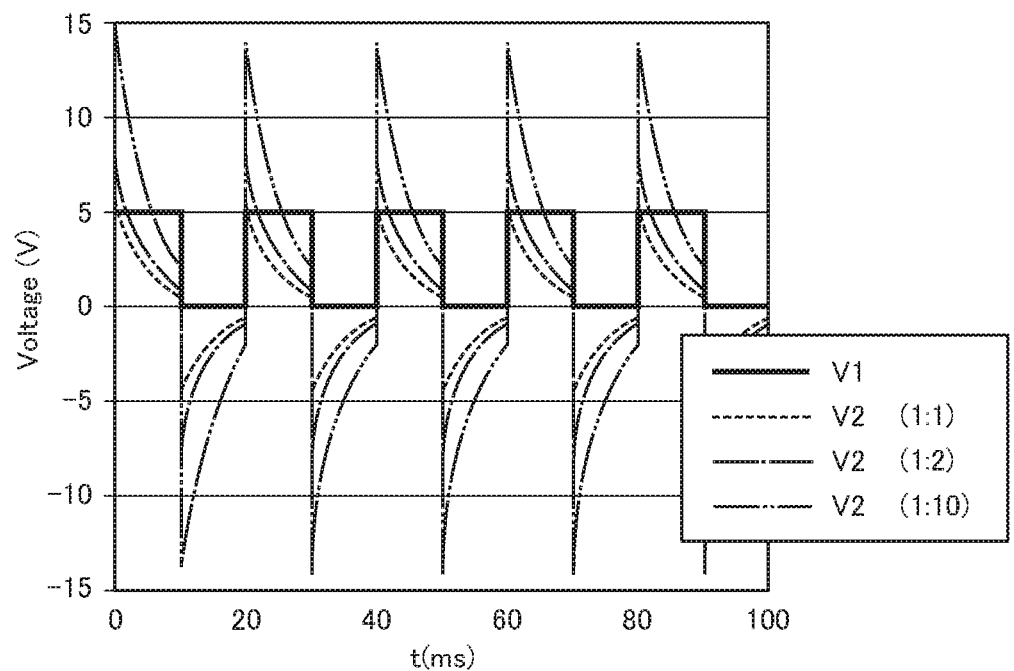
FIG. 10 is a graph showing a relation between the ratio of the number of windings between an exciting coil 31 and the detecting coil 32 and the detection voltage V2.

FIG. 10 is a graph showing a relation between the ratio of the number of windings between the exciting coil 31 and the detecting coil 32 and the detection voltage V2.

FIG. 10 shows that, as the ratio of the number of windings between the exciting coil 31 and the detecting coil 32 (the number of turns of the detecting coil 32/the number of turns of the exciting coil 31) is larger, a rising voltage of the detection voltage V2 is larger and a change amount thereof is also larger. That is, as the ratio of the number of windings is larger, a change in the detection voltage V2 can be detected more easily by the detection circuit 42. Accordingly, it is preferable that the number of turns in the detecting coil 32 is larger than the number of turns in the exciting coil 31.

Figure 11:
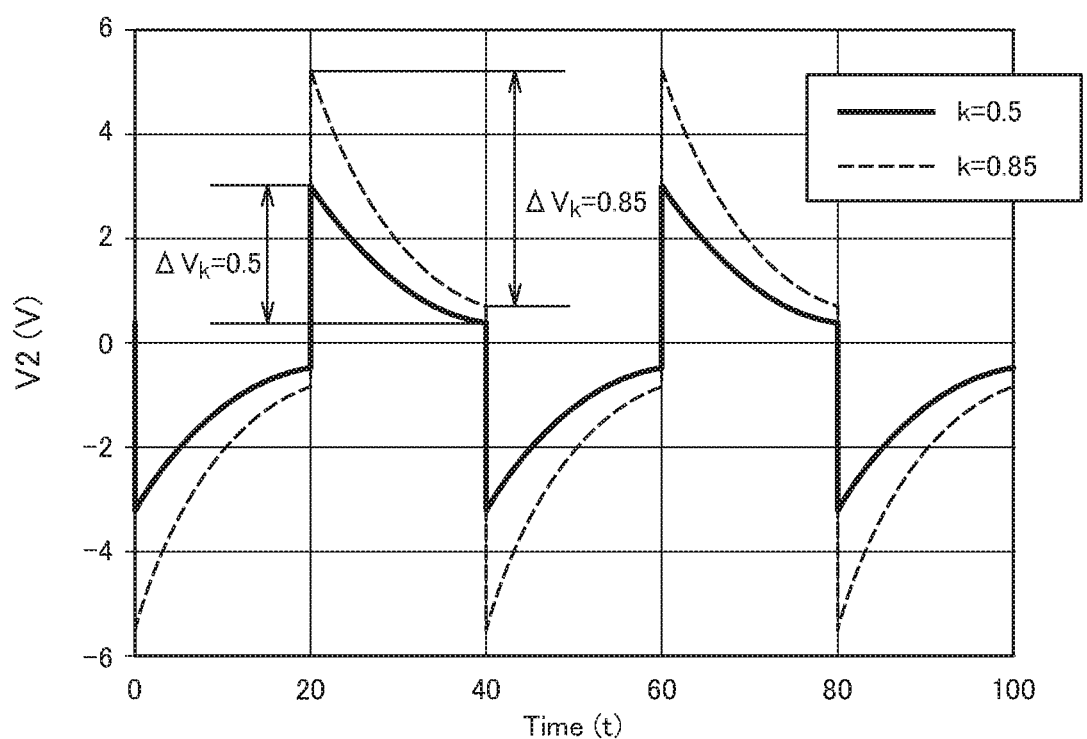
FIG. 11 is a graph showing a relation between a magnetic coupling coefficient k and the detection voltage V2.

FIG. 11 is a graph showing a relation between the magnetic coupling coefficient k and the detection voltage V2.

FIG. 11 illustrates a case where the magnetic coupling coefficient k is 0.5 and a case where the magnetic coupling coefficient k is 0.85. As is apparent from FIG. 11, as the magnetic coupling coefficient k is larger, a change amount ΔV of the detection voltage V2 appearing on the detecting coil 32 is larger. Therefore, it is preferable that the magnetic coupling coefficient k is large. To obtain a large magnetic coupling coefficient k, it is preferable to bifilar wind the exciting coil 31 and the detecting coil 32 as shown in FIG. 2. When the numbers of turns in the exciting coil 31 and the detecting coil 32 are different, it suffices to bifilar wind the exciting coil 31 and the detecting coil 32 in a range in which the numbers of turns are the same.

The circuit using the inductance element 10A for a magnetic sensor according to the first embodiment is not limited to that shown in FIG. 8 and other circuit configurations can be employed. For example, a circuit that measures a second-order harmonic of the detection voltage V2 occurring in the detecting coil 32 can be provided. The circuit that measures a second-order harmonic detects whether a voltage waveform has non-linear characteristics.

When the input voltage V1 is applied to the exciting coil 31 in a case where the voltage waveform does not have non-linearity, odd-order harmonic components, that is, first-order, third-order, fifth-order, seventh-order, . . . harmonic components appear on the detecting coil 32. When the input voltage V1 is applied to the exciting coil 31 in a case where the voltage waveform is non-linear, even-order harmonic components, that is, second-order, fourth-order, sixth-order, . . . harmonic components as well as the odd-order harmonic components appear on the detecting coil 32. The non-linearity in this case mainly indicates non-linearity due to magnetic saturation characteristics of a magnetic body. That is, the second-order harmonic component among the even-order harmonic components caused by a magnetic saturation phenomenon is detected. Although high even-order harmonic components also appear, only the second-order harmonic component is generally used because changes tend to be smaller in higher-order harmonic components.

More specifically, when the input voltage V1 of a sine wave is applied by the signal generation circuit 41, a frequency of an even multiple of the frequency of the sine wave appears as the detection voltage V2 of the detecting coil 32 and the second-order harmonic component thereof is detected. The detection can be realized by performing FFT (Fast Fourier Transform) using a DSP (Digital Signal Processor) or the like when the frequency is sufficiently low. Otherwise, the detection can be realized by extracting only the second-order harmonic component with a bandpass filter and averaging (smoothing) the component to be converted into a voltage and reading the resultant voltage with a DA (Digital-Analog) converter. When the input voltage V1 output from the signal generation circuit 41 has a sine wave, detection of the second-order harmonic component is easy to recognize; however, the input voltage V1 does not need to have a sine wave and can have a rectangular wave or a triangular wave.

Figure 12:
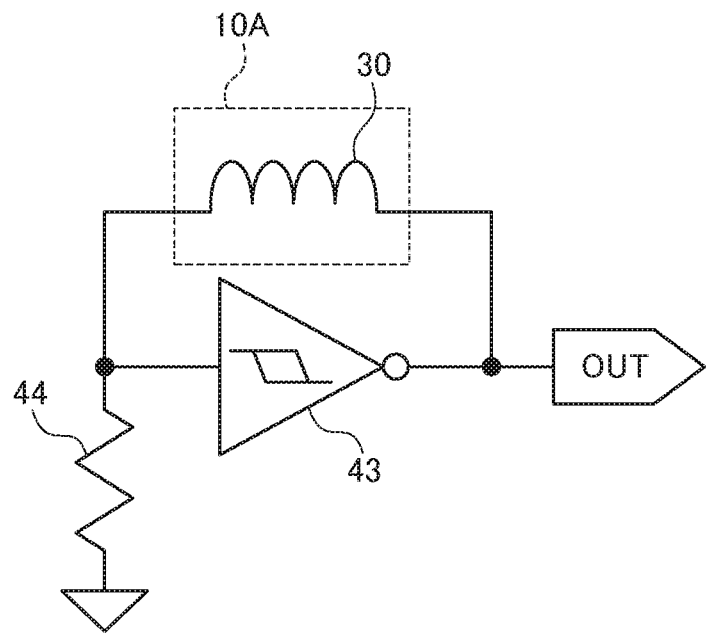
FIG. 12 is an equivalent circuit diagram showing another use example of the inductance element 10A for using a magnetic sensor.

Furthermore, the external magnetic field 40 can be detected also when the coil 30 includes one coil, that is, there is no exciting coil 31. For example, a circuit in which the coil 30 of the inductance element 10A for a magnetic sensor is connected between an input terminal and an output terminal of a Schmitt trigger inverter 43 and further the input terminal of the Schmitt trigger inverter 43 is grounded via a resistor 44 as shown in FIG. 12 can be alternatively used. When the circuit shown in FIG. 12 is used, the frequency of a signal output from the Schmitt trigger 43 changes according to a change of the inductance of the coil 30 and thus the intensity of the external magnetic field 40 can be measured by analyzing the frequency of the signal.

Figure 13:
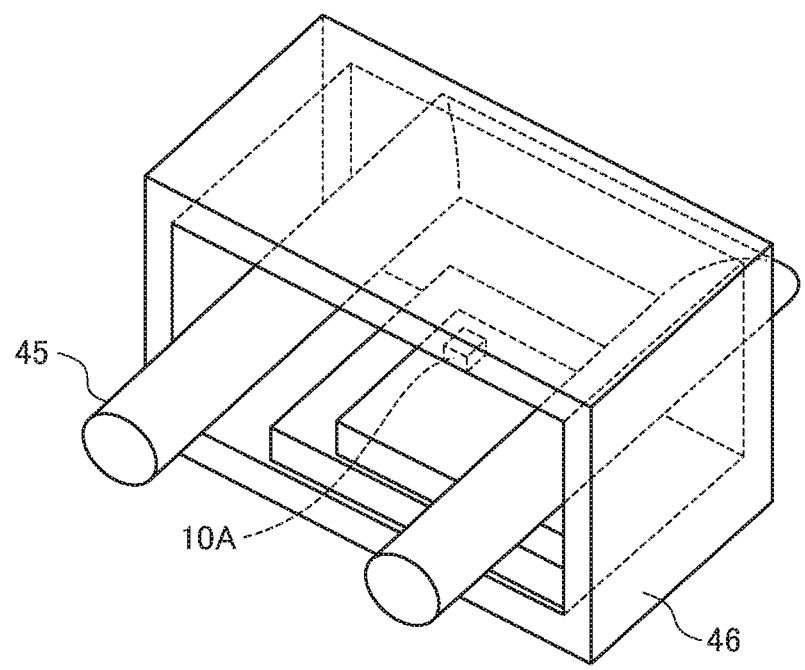
FIG. 13 is a schematic perspective view showing a configuration of a current sensor using the inductance element 10A for using a magnetic sensor.

FIG. 13 is a schematic perspective view showing a configuration of a current sensor using the inductance element 10A for a magnetic sensor according to the present embodiment.

The current sensor shown in FIG. 13 has a configuration in which a bus bar 45 through which a current to be measured flows and a magnetic shield 46 are provided, and the inductance element 10A for a magnetic sensor according to the first embodiment is housed in the magnetic shield 46. The bus bar 45 is bent in a substantially horseshoe shape and the magnetic shield 46 is provided to surround the bent portion of the bus bar 45. The magnetic shield 46 is made of a magnetic material such as ferrite and functions to block an external magnetic field.

When the current to be measured is flowed through the bus bar 45, a magnetic field corresponding to the current amount occurs, which is detected by the inductance element 10A for a magnetic sensor. The detecting coil 32 of the inductance element 10A for a magnetic sensor is connected, for example, to the detection circuit 42 shown in FIG. 8 and a voltage thus appearing on the detecting coil 32 is monitored. This configuration enables the amount of the current flowing through the bus bar 45 to be detected by the inductance element 10A for a magnetic sensor. In this way, the inductance element 10A for a magnetic sensor according to the first embodiment can be used as a part of the current sensor.

Hereinafter, inductance elements for a magnetic sensor according to other embodiments of the present invention will be described.

Figure 14:
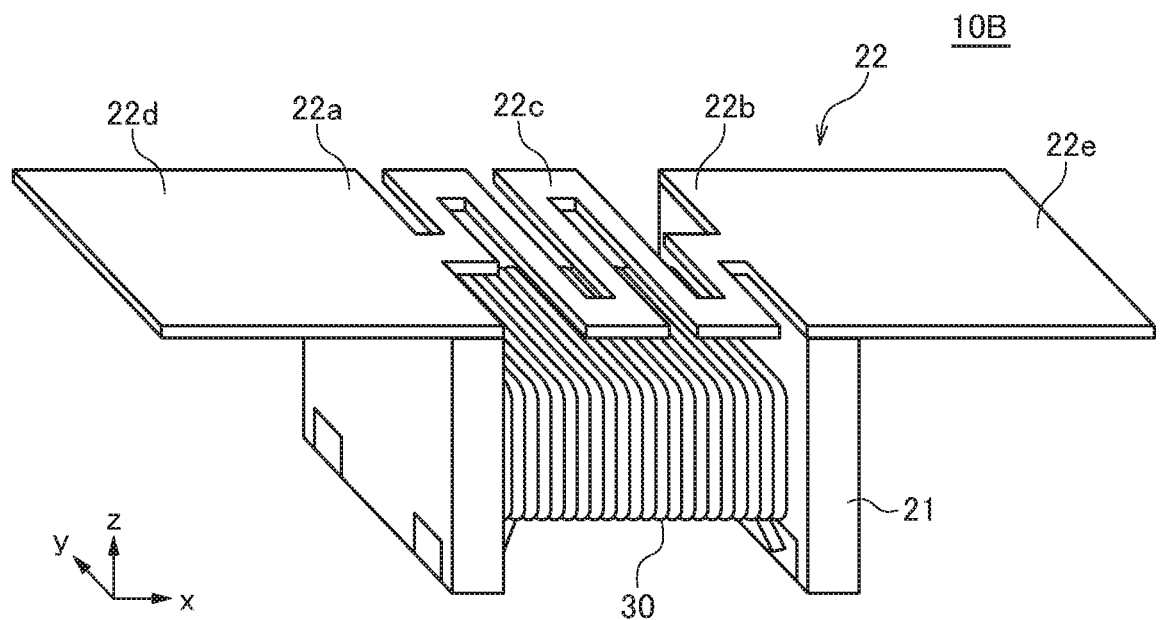
FIG. 14 is a perspective view showing a configuration of an inductance element 10B for using a magnetic sensor according to a second embodiment of the present invention.

FIG. 14 is a perspective view illustrating the inductance element 10B for a magnetic sensor according to the second embodiment of the present invention.

The inductance element 10B for a magnetic sensor illustrated in FIG. 14 differs from the inductance element for a magnetic sensor 10A according to the first embodiment illustrated in FIGS. 1A to 1C in that the length of the second core 22 in the axial direction (x-direction) is larger than that of the first core 21. That is, in the present embodiment, the second core 22 has not only the connecting parts 22a, 22b and closed magnetic path part 22c, but also protruding parts 22d and 22e positioned on the sides opposite to the closed magnetic path part 22c when viewed from the connecting parts 22a and 22b, respectively. Other configurations are the same as those of the inductance element 10A for a magnetic sensor according to the first embodiment, so the same reference numerals are given to the same elements, and overlapping description will be omitted.

Because the length of the second core 22 is increased in the axial direction in the inductance element 10B for a magnetic sensor according to the second embodiment, the external magnetic field can be captured more effectively. Accordingly, measurement with a higher sensitivity can be provided. Furthermore, because the directivity in the axial direction is enhanced, the magnetic sensor 10B also has an advantage that the direction of a measurement target object that generates a magnetic field can be easily specified.

Figure 15:
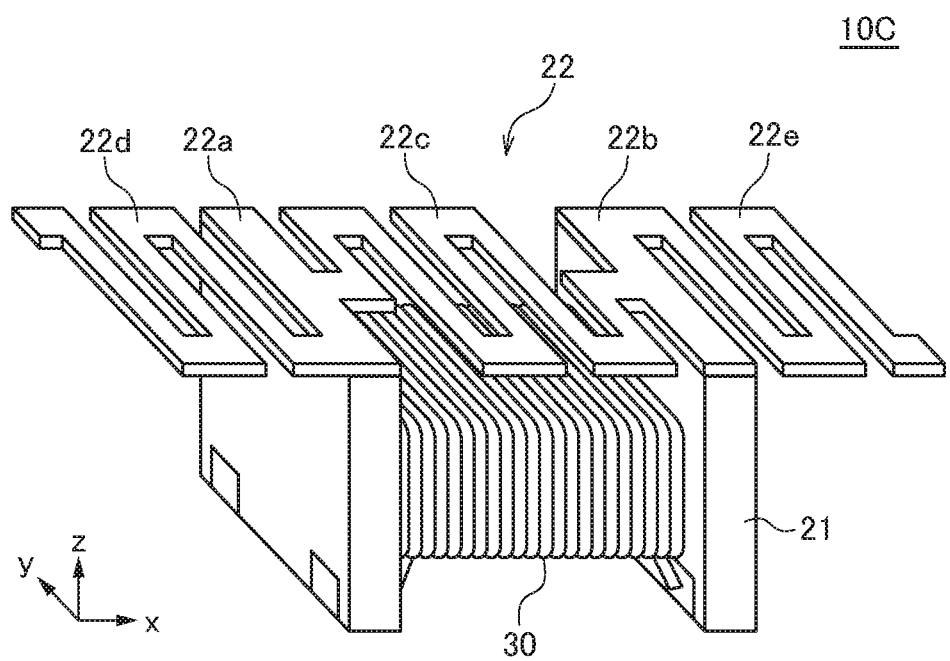
FIG. 15 is a perspective view showing a configuration of an inductance element 10C for using a magnetic sensor according to a third embodiment of the present invention.

FIG. 15 is a perspective view illustrating the inductance element for a magnetic sensor 10C according to the third embodiment of the present invention.

The inductance element 10C for a magnetic sensor illustrated in FIG. 15 differs from the inductance element 10B for a magnetic sensor according to the second embodiment illustrated in FIG. 14 in that the protruding parts 22d and 22e of the second core 22 each have a meander shape. Other configurations are the same as those of the inductance element 10B for a magnetic sensor according to the second embodiment, so the same reference numerals are given to the same elements, and overlapping description will be omitted.

With this configuration, it is possible to increase the magnetic path lengths of the respective protruding parts 22d and 22e while suppressing the protruding amounts of the respective protruding parts 22d and 22e in the x-direction. The increase in the magnetic path lengths of the protruding parts 22d and 22e makes the degree of influence of the second core 22 higher than that of the first core 21, so that a change in the inductance in the first area (I) illustrated in FIG. 7 becomes more abrupt, resulting in enhancement of detection sensitivity. In addition, the degree of influence of the first core 21 becomes comparatively low, so that the abrupt drop of the inductance at the boundary between the second area (II) and the third area (III) illustrated in FIG. 7 is alleviated, thus facilitating the measurement. In order to sufficiently obtain such effects, it is necessary to ensure sufficient magnetic path lengths of the respective protruding parts 22d and 22e. Thus, in the present embodiment, the protruding parts 22d and 22e are each formed into a meander shape, it is therefore possible to obtain the above effects while minimizing an increase in the x-direction size.

Figure 16:
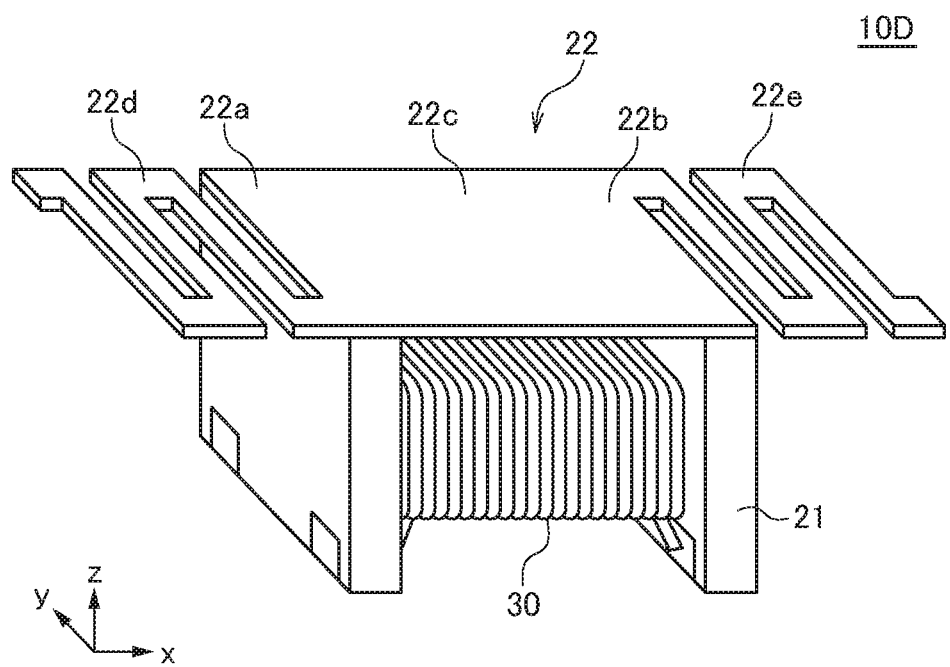
FIG. 16 is a perspective view showing a configuration of an inductance element 10D for using a magnetic sensor according to a fourth embodiment of the present invention.

FIG. 16 is a perspective view illustrating the inductance element 10D for a magnetic sensor according to the fourth embodiment of the present invention.

The inductance element 10D for a magnetic sensor illustrated in FIG. 16 differs from the inductance element 10C for a magnetic sensor according to the third embodiment illustrated in FIG. 15 in that the closed magnetic path part 22c of the second core 22 does not have a meander shape but has a simple plate-like shape. Other configurations are the same as those of the inductance element 10C for a magnetic sensor according to the third embodiment, so the same reference numerals are given to the same elements, and overlapping description will be omitted.

With this configuration, it is possible to increase the magnetic path lengths of the respective protruding parts 22d and 22e without increasing the magnetic path lengths of the closed magnetic path part 22c. As exemplified in the present embodiment, it is not essential in the present invention that the closed magnetic path part 22c have a meander shape, but it is only necessary that at least a part of the second core 22 have a meander shape. Which part of the second core 22 is to be formed into a meander shape may be determined appropriately depending on target characteristics or a target size.

Figure 17:
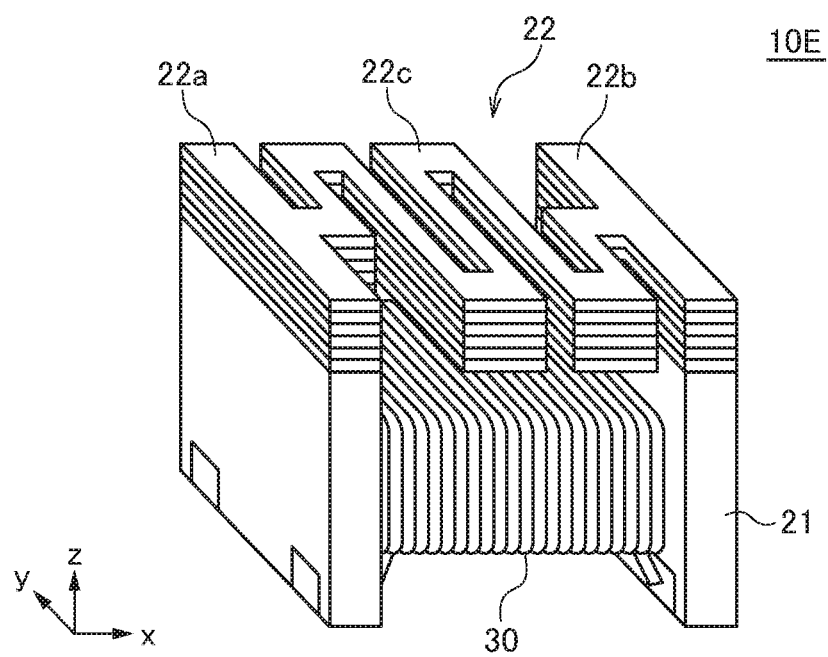
FIG. 17 is a perspective view showing a configuration of an inductance element 10E for using a magnetic sensor according to a fifth embodiment of the present invention.

FIG. 17 is a perspective view illustrating the inductance element 10E for a magnetic sensor according to the fifth embodiment of the present invention.

The inductance element 10E for a magnetic sensor illustrated in FIG. 17 differs from the inductance element 10A for a magnetic sensor according to the first embodiment illustrated in FIGS. 1A to 1C in that the second core 22 has a layered structure in the thickness direction. Other configurations are the same as those of the inductance element 10A for a magnetic sensor according to the first embodiment, so the same reference numerals are given to the same elements, and overlapping description will be omitted.

According to the inductance element 10E for a magnetic sensor, because the second core 22 has the stack structure, the sensitivity dL/dB is lowered; however, the second core 22 becomes unlikely to be saturated as a trade-off, which widens the range of an external magnetic field (magnetic flux density) that can be sensed. This is because the sectional area of the Fe/Co amorphous magnetic metal is equivalently increased due to staking. As is known in application of a silicon steel plate or the like, when a plurality of magnetic bodies are stacked, a minute gap occurs between the magnetic bodies and an eddy current is divided. Accordingly, loss due to eddy-current loss can be reduced.

Figure 18:
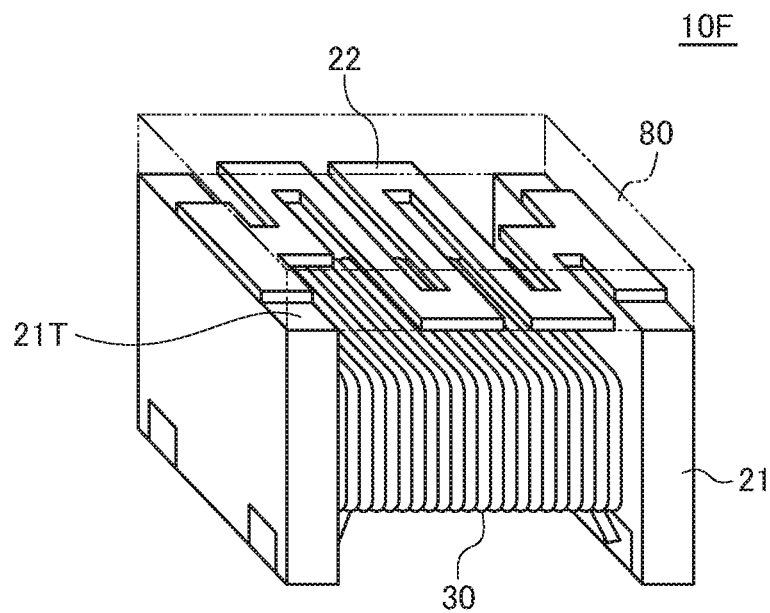
FIG. 18 is a perspective view showing a configuration of an inductance element 10F for using a magnetic sensor according to a sixth embodiment of the present invention.

FIG. 18 is a perspective view illustrating the inductance element 10F for a magnetic sensor according to the sixth embodiment of the present invention.

Figure 19:
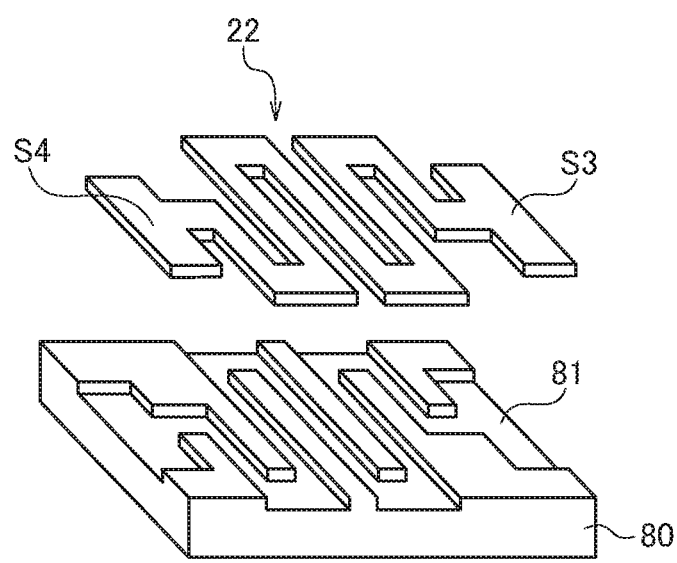
FIG. 19 is a perspective view of a support member 80 viewed from a side of a bonding surface.

The inductance element 10F for a magnetic sensor shown in FIG. 18 further includes a support member 80 that covers the second core 22. The support member 80 and the upper surface 21T of the first core 21 are bonded with an adhesive. The support member 80 is made of, for example, a resin. The support member 80 has a recessed portion 81 that houses the second core 22 therein as shown in FIG. 19 showing a state of the support member 80 inverted and viewed from the side of a bonding surface. The depth of the recessed portion 81 is set to be equivalent to or slightly larger than the thickness of the second core 22. In the ninth embodiment, the widths of the connection surfaces S3 and S4 on the second core 22 in the y-direction are narrower than those of the connection surfaces S1 and S2 on the first core 21. In areas corresponding to differences in the widths, the support member 80 and the flange portions 21b and 21c of the first core 21 face directly each other without the second core 22 interposed therebetween. When an adhesive is coated on these areas to bond the support member 80 and the flange portions 21b and 21c of the first core 21, the first core 21 and the second core 22 can be positioned with respect to each other without an adhesive interposed therebetween.

With this configuration, in the present embodiment, the first core 21 and the second core 22 can be positioned with respect to each other with no engaging portion provided thereon and with no adhesive interposed therebetween. Furthermore, in the present embodiment, because the closed magnetic path part 22c of the second core 22 has a meander shape and the recessed portion of the support member 80 has a shape corresponding thereto, the second core 22 does not fall off after the support member 80 is bonded to the first core 21.

While the preferred embodiments of the present invention have been described, the present invention is not limited thereto. Thus, various modifications may be made without departing from the gist of the invention, and all of the modifications thereof are included in the scope of the present invention.

For example, the inductance elements 10B to 10D for a magnetic sensor illustrated in FIGS. 14 to 16 each have the protruding parts 22d and 22e having the same length in the x-direction; however, the lengths of the protruding parts 22d and 22e in the x-direction need not be the same, but may differ from each other. Further, one of the protruding parts 22d and 22e may be omitted.

Example 1

Figure 20A:
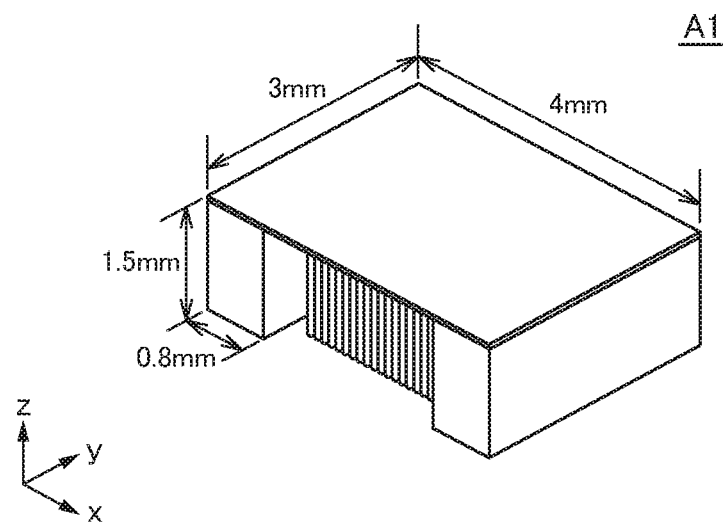
FIG. 20A is a perspective view showing a configuration of a sample A1.
Figure 20B:
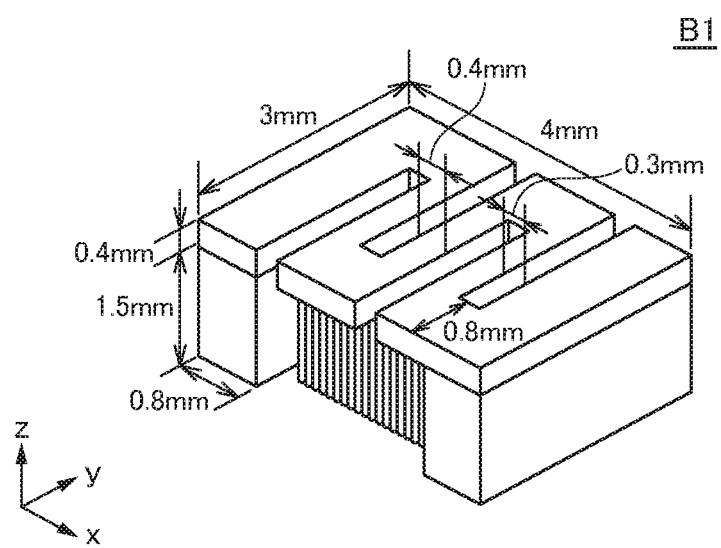
FIG. 20B is a perspective view showing a configuration of a sample B1.

Magnetic characteristics of each of a sample A1 (FIG. 20A) and a sample B1 (FIG. 20B) were simulated. In both the samples A1 and B1, the size of the drum-shaped first core is set such that x=4.0 mm, y=3.0 mm, and z=1.5 mm, and the thickness of each of the flange parts in the x-direction is set to 0.8 mm. The second core of the sample A1 has a plate-like shape, while the second core of the sample B1 has a meander shape. In order to make inductances in the absence of external magnetic field coincide with each other, the z-direction thickness of the second core of the sample A1 is set to 0.025 mm and that of the second core of the sample B1 is set to 0.4 mm. As a result, inductance (AL-Value) per one turn is about 1 $\mu H/N^2$ (N is the number of turns) in each sample.

Figure 21:
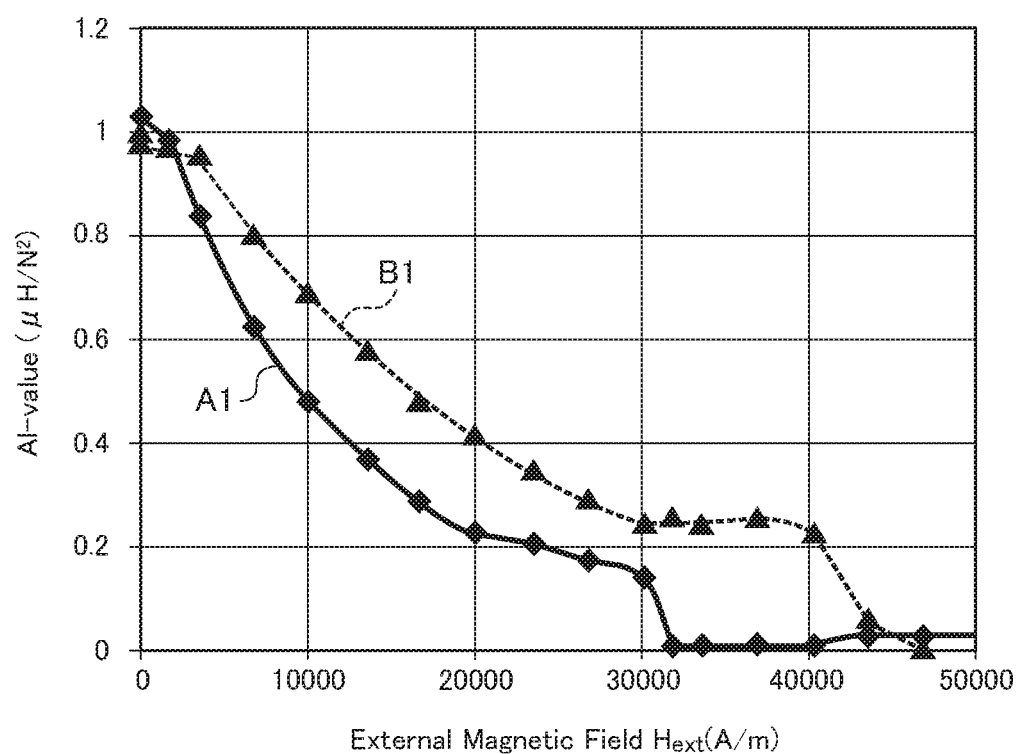
FIG. 21 illustrates simulation results representing magnetic characteristics of each of the samples A1 and B1.

FIG. 21 illustrates simulation results representing magnetic characteristics of each of the samples A1 and B1.

As illustrated in FIG. 21, complete magnetic saturation is achieved when the external magnetic field reaches about 30000H (A/m) in the sample A1, while in the sample B1, magnetic saturation is not achieved until when the external magnetic field reaches 40000 H (A/m). Thus, in the sample B1, even when the external magnetic field is comparatively strong, external magnetic field can be measured without occurrence of magnetic saturation.

Example 2

Figure 22A:
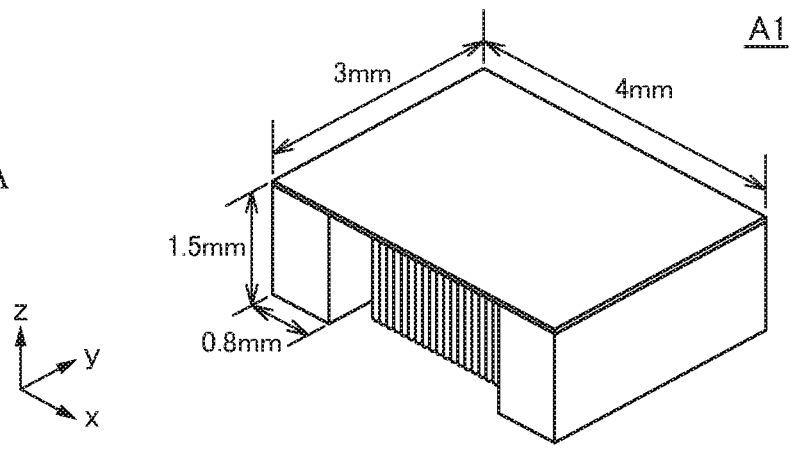
FIG. 22A is a perspective view showing a configuration of a sample A1.
Figure 22B:
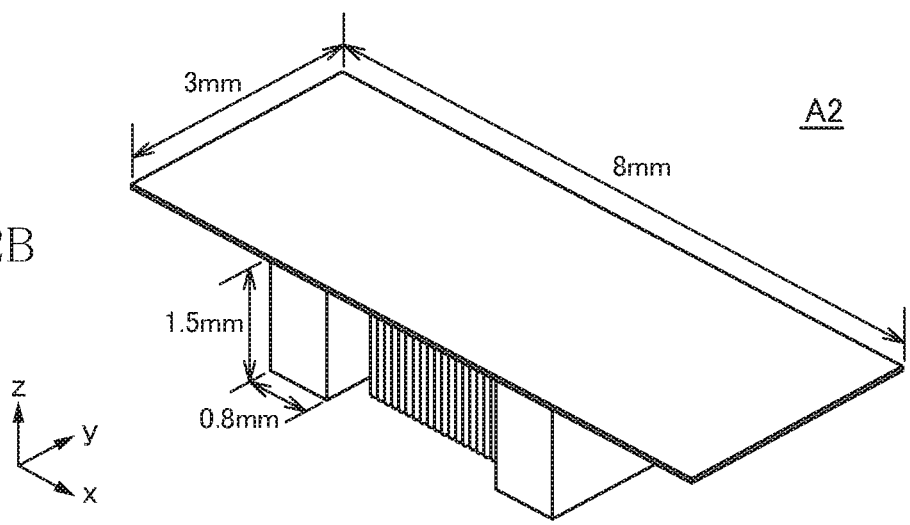
FIG. 22B is a perspective view showing a configuration of a sample A2.
Figure 22C:
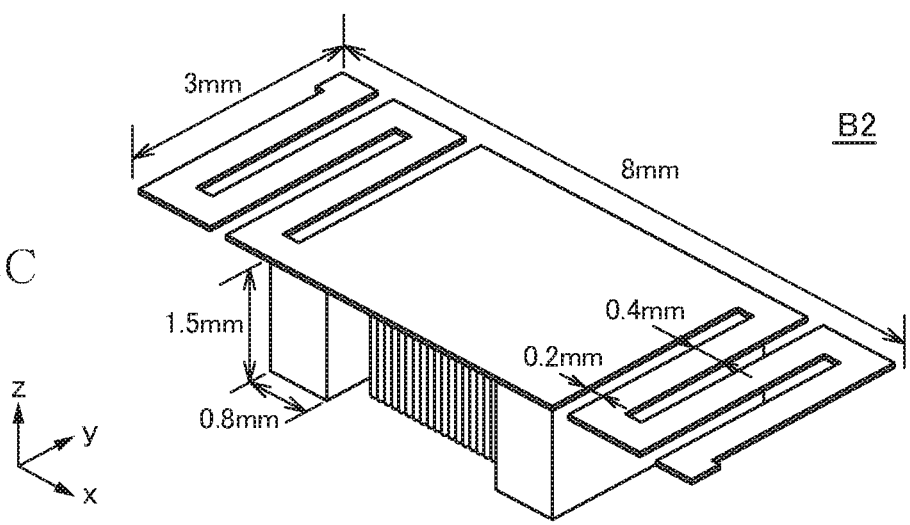
FIG. 22C is a perspective view showing a configuration of a sample B2.

Magnetic characteristics of each of the sample A1 (FIG. 22A), a sample A2 (FIG. 22B), and a sample B2 (FIG. 22C) were simulated. The sample A1 is the same as the sample A1 illustrated in FIG. 20A. The size of the first core in the samples A1, A2, and B2 is the same as that of Example 1 (x=4.0 mm, y=3.0 mm, and z=1.5 mm, and the thickness of each of the flange parts in the x-direction=0.8 mm). The second core of the sample A1 has a plate-like shape and is not provided with the protruding parts. The second core of the sample A2 has a plate-like shape and is provided with the protruding parts. The second core of the sample B2 has meander-shaped protruding parts. In the samples A2 and B2, the size of the second core 22 in the x-direction is set to 8.0 mm. In all the samples, the thickness of the second core in the z-direction is set to 0.025 mm.

Figure 23:
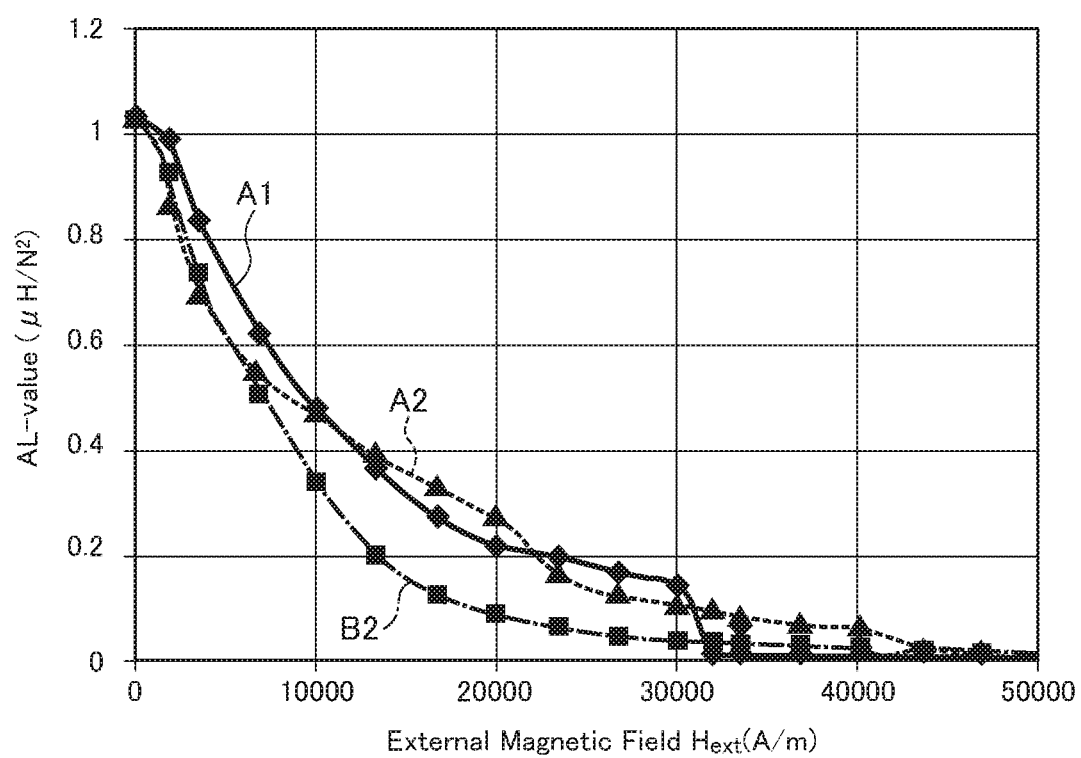
FIG. 23 illustrates simulation results representing magnetic characteristics of each of the samples A1, A2, and B2.

FIG. 23 illustrates simulation results representing magnetic characteristics of each of the samples A1, A2, and B2.

As illustrated in FIG. 23, abrupt drop of inductance appearing near about 30000 H (A/m) of the external magnetic field in the sample A1 not provided with the protruding parts does not appear in the samples A2 and B2 each provided with the protruding parts. Further, a change in inductance is more abrupt and more linear in the sample B2 provided with the meander-shaped protruding parts than in the sample A2 provided with the plate-like protruding parts. As described above, it can be seen that the sample B2 can obtain satisfactory and linear detection sensitivity.

What is claimed is:

1. An inductance element for a magnetic sensor, the inductance element comprising:
   a first core comprising a first soft magnetic material and having first and second connecting surfaces;
   a second core comprising a second soft magnetic material different from the first soft magnetic material and having third and fourth connecting surfaces facing the first and second connecting surfaces, respectively; and
   a coil wound around the first core between the first and second connecting surfaces,
   wherein the first core is larger in magnetic field strength at which magnetic saturation occurs than the second core, and
   wherein the second core is higher in permeability than the first core and comprises at least a portion that has a meander shape when viewed from a direction perpendicular to the first to fourth connecting surface, the at least portion of the second core having the meander shape comprising a plurality of alternately-arranged parts extending in different directions to define a plurality of voids therebetween that extend through an entire thickness of the second core, and
   wherein the third and fourth connecting surfaces cover the first and second connecting surfaces, respectively, and wherein the meander shape is defined between the third and fourth connecting surfaces such that a magnetic flux along the plurality of alternately-arranged parts follows a meandering path that is narrower than either of the third and fourth surfaces, that begins between respective ends of the third connecting surface and that ends between respective ends of the fourth connecting surface.

2. The inductance element for a magnetic sensor as claimed in claim 1, wherein the portion of the second core having the at least partially meander shape is positioned between the third and fourth connecting surfaces.

3. The inductance element for a magnetic sensor as claimed in claim 1,
   wherein the second core has a closed magnetic path part positioned between the third and fourth connecting surfaces and a protruding part positioned on an opposite side to the closed magnetic path part when viewed from the third or fourth connecting surface, and
   wherein the portion of the second core having the at least partially meander shape is at least one of the closed magnetic path part and the protruding part.

4. The inductance element for a magnetic sensor as claimed in claim 1,
   wherein the first core is a drum-shaped core having a winding core part around which the coil is wound and first and second flange parts provided respectively on both sides of the winding core part in an axial direction,
   wherein the first flange part has a first terminal electrode connected with one end of the coil,
   wherein the second flange part has a second terminal electrode connected with other end of the coil,
   wherein a surface of the first flange part parallel to the axial direction constitutes the first connecting surface, and
   wherein a surface of the second flange part parallel to the axial direction constitutes the second connecting surface.

5. The inductance element for a magnetic sensor as claimed in claim 1, wherein the second core has a layered structure in a thickness direction.

6. The inductance element for a magnetic sensor as claimed in claim 1, wherein the first and second cores are positioned relative to each other without an intervention of an adhesive.

7. The inductance element for a magnetic sensor as claimed in claim 6, further comprising a support member for positioning the second core relative to the first core,
   wherein the support member has an adhesive surface in which a concave part for housing the second core is formed, and
   wherein the adhesive surface of the support member is adhered to the first and second connecting surfaces of the first core, whereby the second core is positioned, sandwiched between the concave part of the support member and the first core.

8. The inductance element for a magnetic sensor as claimed in claim 1, wherein the first soft magnetic material is ferrite and the second soft magnetic material is amorphous magnetic metal.

9. The inductance element for a magnetic sensor as claimed in claim 1, wherein the portion of the second core having the at least partially meander shape is configured such that a length of a magnetic path along a closed magnetic path part of the second core is longer than a linear distance between the first and second connecting surfaces.

10. An apparatus comprising:
    a drum-shaped core including a winding core part and first and second flange parts provided respectively on both sides of the winding core part in a first direction;
    a meander-shaped core stacked on the drum-shaped core in a second direction perpendicular to the first direction, the meander-shaped core including a first end connected to the first flange part and a second end connected to the second flange part; and
    a coil wound around the winding core part,
    wherein the meander-shaped core defines a plurality of pairs of facing surfaces that are separated from each other by respective voids that extend through an entire thickness of the second core such that a magnetic path length of the meander-shaped core between the first and second ends is greater than a direct distance between the first and second flange parts,
    wherein the meander-shaped core covers the first and second flange parts, and wherein the meander-shape core causes a magnetic flux to be constrained along the plurality of alternately-arranged parts and to follow a meandering path that is narrower than either of the first and second flange parts, that begins between respective ends of the first flange part and that ends between respective ends of the second flange part.

11. The apparatus as claimed in claim 10,
wherein the meander-shaped core further includes first and second sections located between the first and second ends,
wherein the first section extends in the first direction, and
wherein the second section extends in a third direction.

12. The apparatus as claimed in claim 11, wherein the first direction is substantially parallel with an axial direction of the drum-shaped core.

13. The apparatus as claimed in claim 10,
wherein the meander-shaped core further includes a plurality of first sections and a plurality of second sections located between the first and second ends,
wherein each of the first sections extends in the first direction, and
wherein each of the second sections extends in a third direction.

14. The apparatus as claimed in claim 13, wherein the first and second sections are alternately arranged between the first and second ends.

15. The apparatus as claimed in claim 14, wherein adjacent two of the first sections are connected to one of the second sections such that magnetic flux flows opposite directions in the two of the first sections.

16. The apparatus as claimed in claim 10, wherein the meander-shaped core has higher permeability than the drum-shaped core.

17. The apparatus as claimed in claim 16, wherein the drum-shaped core is larger in magnetic field strength at which magnetic saturation occurs than the meander-shaped core.

* * * * *

UNITED STATES PATENT AND TRADEMARK OFFICE
CERTIFICATE OF CORRECTION

PATENT NO. : 10,884,077 B2
APPLICATION NO. : 15/725568
DATED : September 22, 2020
INVENTOR(S) : Takahiro Hamamura et al.

It is certified that error appears in the above-identified patent and that said Letters Patent is hereby corrected as shown below:

On the Title Page

Please add:
Foreign Application Priority Data
Oct. 19, 2016[JP]         2016-205327

Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*